(12) United States Patent
Farnworth et al.

(10) Patent No.: US 8,896,105 B2
(45) Date of Patent: Nov. 25, 2014

(54) MICROELECTRONIC DEVICES AND METHODS FOR MANUFACTURING MICROELECTRONIC DEVICES

(71) Applicant: Micron Technology, Inc., Boise, ID (US)

(72) Inventors: Warren M. Farnworth, Nampa, ID (US); Kristy A. Campbell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/056,669

(22) Filed: Oct. 17, 2013

(65) Prior Publication Data
US 2014/0042575 A1     Feb. 13, 2014

Related U.S. Application Data

(62) Division of application No. 11/375,977, filed on Mar. 15, 2006, now Pat. No. 8,569,093.

(51) Int. Cl.
*H01L 23/552*   (2006.01)
*H01L 31/02*   (2006.01)
*H01L 23/00*   (2006.01)

(52) U.S. Cl.
CPC .............. *H01L 31/02* (2013.01); *H01L 23/552* (2013.01); *H01L 24/32* (2013.01);
(Continued)

(58) Field of Classification Search
CPC ...................... H01L 21/76838; H01L 31/0481; H01L 51/5253

USPC ................. 257/428, 431, 659, 660, 690, 729; 438/57, 64
See application file for complete search history.

(56) References Cited

U.S. PATENT DOCUMENTS 5,241,040 A    8/1993   Cuomo et al.
5,272,216 A   12/1993   Clark, Jr. et al.
(Continued)

OTHER PUBLICATIONS

Hubbard, R.L. et al., "Low Temperature Curing of Polyimide Wafer Coatings," 3 pages, <http://www.microcure.com/vfmpapers/pdf/IEMT04Hubbard%20_2_.pdf>.
Matsutani, H. et al., "Low Temperature Curing of Polyimide Precursors by Variable Frequency Microwave," 6 pages, <http://www.microcure.com/vfmpapers/pdf/HDMPaper5-05.pdf>.

*Primary Examiner* — Olik Chaudhuri
*Assistant Examiner* — John M Parker
(74) *Attorney, Agent, or Firm* — Perkins Coie LLP (57) ABSTRACT

Microelectronic devices and methods for manufacturing microelectronic devices are disclosed herein. In one embodiment, a method includes constructing a radiation sensitive component in and/or on a microelectronic device, placing a curable component in and/or on the microelectronic device, and forming a barrier in and/or on the microelectronic device to at least partially inhibit irradiation of the radiation sensitive component. The radiation sensitive component can be doped silicon, chalcogenide, polymeric random access memory, or any other component that is altered when irradiated with one or more specific frequencies of radiation. The curable component can be an adhesive, an underfill layer, an encapsulant, a stand-off, or any other feature constructed of a material that requires curing by irradiation.

19 Claims, 4 Drawing Sheets

(52) U.S. Cl.
CPC ............... *H01L 24/83* (2013.01); *H01L 24/29* (2013.01); *H01L 24/48* (2013.01); *H01L 2224/2919* (2013.01); *H01L 2224/32225* (2013.01); *H01L 2224/48091* (2013.01); *H01L 2224/48227* (2013.01); *H01L 2224/73265* (2013.01); *H01L 2224/83101* (2013.01); *H01L 2224/83855* (2013.01); *H01L 2224/83865* (2013.01); *H01L 2924/01029* (2013.01); *H01L 2924/01047* (2013.01); *H01L 2924/01078* (2013.01); *H01L 2924/01079* (2013.01); *H01L 2924/014* (2013.01); *H01L 2924/15184* (2013.01); *H01L 2924/15311* (2013.01); *H01L 2924/3025* (2013.01); *H01L 2924/01005* (2013.01); *H01L 2924/01006* (2013.01); *H01L 2924/01033* (2013.01); *H01L 2924/14* (2013.01); *H01L 2924/0665* (2013.01)
USPC .......... 257/659; 257/729; 257/738; 438/127; 438/613; 438/795

(56) References Cited

U.S. PATENT DOCUMENTS

| | | |
|---|---|---|
| 5,296,271 A | 3/1994 | Swirbel et al. |
| 5,321,222 A | 6/1994 | Bible et al. |
| 5,366,573 A | 11/1994 | Bayer et al. |
| 5,644,837 A | 7/1997 | Fathi et al. |
| 5,648,038 A | 7/1997 | Fathi et al. |
| 5,738,915 A | 4/1998 | Fathi et al. |
| 5,750,968 A | 5/1998 | Fathi et al. |
| 5,798,395 A | 8/1998 | Lauf et al. |
| 5,804,801 A | 9/1998 | Lauf et al. |
| 5,844,216 A | 12/1998 | Fathi et al. |
| 6,103,812 A | 8/2000 | Wei et al. |
| 6,211,499 B1 | 4/2001 | Morrow et al. |
| 6,268,200 B1 | 7/2001 | Tucker et al. |
| 6,312,548 B1 | 11/2001 | Fathi et al. |
| 6,758,609 B2 | 7/2004 | Fathi et al. |
| 6,872,927 B2 | 3/2005 | Geisler et al. |
| 7,691,682 B2 | 4/2010 | Wan et al. |
| 2007/0218583 A1 | 9/2007 | Farnworth et al. |

Fig. 8

MICROELECTRONIC DEVICES AND METHODS FOR MANUFACTURING MICROELECTRONIC DEVICES

CROSS-REFERENCE TO RELATED APPLICATION

This application is a divisional of U.S. application Ser. No. 11/375,977 filed Mar. 15, 2006, now U.S. Pat. No. 8,569,093, which is incorporated herein by reference in its entirety.

TECHNICAL FIELD

The present invention is related to microelectronic devices and methods for manufacturing microelectronic devices.

BACKGROUND

Microelectronic devices generally have a die (i.e., a chip) that includes integrated circuitry having a high density of very small components. In a typical process, a large number of dies are manufactured on a single wafer using many different processes that may be repeated at various stages (e.g., implanting, doping, photolithography, chemical vapor deposition, physical vapor deposition, plasma enhanced chemical vapor deposition, plating, planarizing, etching, etc.). The dies typically include an array of very small bond-pads electrically coupled to the integrated circuitry. The bond-pads are the external electrical contacts on the die through which the supply voltage, signals, etc., are transmitted to and from the integrated circuitry. The wafer is then thinned by backgrinding and the dies are separated from one another (i.e., singulated) by dicing the wafer. After the dies have been singulated, they are typically "packaged" to couple the bond-pads to a larger array of electrical terminals that can be more easily coupled to the various power supply lines, signal lines, and ground lines.

Figure 1:
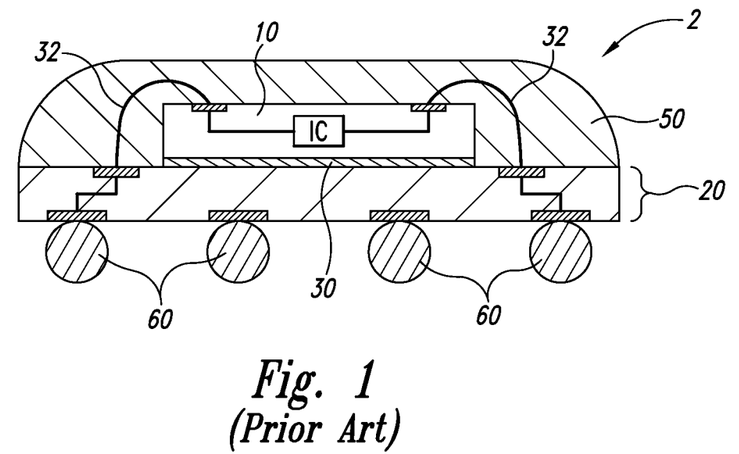
FIG. 1 schematically illustrates a conventional packaged microelectronic device.

Conventional processes for packaging dies include electrically coupling the bond-pads on the dies to an array of pins, ball-pads, or other types of electrical terminals, and then encapsulating the dies to protect them from environmental factors (e.g., moisture, particulates, static electricity, and physical impact). In one application, the bond-pads are electrically connected to contacts on an interposer substrate that has an array of ball-pads. For example, FIG. 1 schematically illustrates a conventional packaged microelectronic device 2 including a microelectronic die 10, an interposer substrate 20 attached to the die 10 with an adhesive 30, a plurality of wire-bonds 32 electrically coupling the die 10 to the substrate 20, a casing 50 protecting the die 10 from environmental factors, and a plurality of solder balls 60 attached to the substrate 20. After assembly, the adhesive 30 and the casing 50 are typically cured to form a robust packaged device 2.

Another type of microelectronic device is a "flip-chip" semiconductor device. These devices are referred to as "flip-chips" because they are typically manufactured on a wafer and have an active side with bond-pads that initially face upward. After manufacture is completed and a die is singulated, the die is inverted or "flipped" such that the active side bearing the bond-pads faces downward for attachment to an interposer substrate. The bond-pads are usually coupled to terminals, such as conductive "bumps," that electrically and mechanically connect the die to the interposer substrate. The bumps on the flip-chip can be formed from solders, conductive polymers, or other materials. In applications using solder bumps, the solder bumps are reflowed to form a solder joint between the flip-chip component and the substrate, which leaves a small gap between the flip-chip and the interposer substrate. To enhance the integrity of the joint between the microelectronic component and the substrate, an underfill material may be introduced into the gap. The underfill material bears some of the stress placed on the components and protects the components from moisture, chemicals, and other contaminants. After flowing the underfill material into the gap between the flip-chip component and the substrate, the underfill material is cured.

Conventional methods for curing underfill materials, encapsulants, adhesives, and other compounds include either heating the curable material with various techniques or irradiating the curable material with microwave energy at a fixed frequency. One advantage of irradiating the material is that the time required to cure the material is reduced. Curing materials with microwave energy at a fixed frequency, however, has several drawbacks. For example, when microwave energy is applied to a microelectronic substrate, arcing and/or excessive heat accumulation may occur and cause localized damage to the substrate and the component to which the substrate is mounted. Arcing results from the build-up of a charge differential between different components or between one or more of the electronic elements within the components. When the difference in potential exceeds the resistance of a dielectric medium, such as air, the result is a release of the built-up charge through the dielectric medium manifested by an arc between the two oppositely charged components. Moreover, microwave energy may heat certain portions of the conductive circuitry more rapidly than other portions, which may damage the circuitry.

One existing approach to address such drawbacks of curing materials with fixed-frequency microwave energy is to vary the frequency of the applied microwave energy. Sweeping the frequency prevents the build-up of a charge differential and the excessive accumulation of heat. As a result, variable frequency microwave curing typically avoids arcing and the associated localized damage to microelectronic components. One problem with this approach, however, is that applying microwave energy over a range of frequencies may adversely affect other components within the microelectronic device. For example, doped silicon, polymeric random access memory, and chalcogenide are irreversibly changed when exposed to microwave energy at certain frequencies. Specifically, with regard to doped silicon, microwave energy can cause dopant atoms to diffuse throughout a substrate and render the doped structure and other features in the substrate defective. As a result, there exists a need to improve the process of curing materials in microelectronic devices.

DETAILED DESCRIPTION

A. Overview

The following disclosure describes several embodiments of microelectronic devices and methods for manufacturing microelectronic devices. An embodiment of one such method includes constructing a radiation sensitive component in and/or on a microelectronic device, placing a curable component in and/or on the microelectronic device, and forming a barrier in and/or on the microelectronic device to at least partially inhibit irradiation of the radiation sensitive component. The radiation sensitive component can be doped silicon, chalcogenide, polymeric random access memory, or any other component that is altered when irradiated with one or more specific frequencies of radiation. The curable component can be an adhesive, an underfill layer, an encapsulant, a stand-off, or any other feature constructed of a material that requires curing by irradiation.

In another embodiment, a method includes providing a substrate having a radiation sensitive component and constructing a conductive barrier at the substrate for at least partially reflecting radiation directed toward the radiation sensitive component during curing. The conductive barrier can be formed on an exterior surface of the substrate or internally within the substrate. Alternatively, the barrier can be formed on and/or in another substrate or member adjacent to the first substrate.

In another embodiment, a method includes (a) constructing a microelectronic device having a substrate, a radiation sensitive component in and/or on the substrate, a curable component in and/or on the substrate, and a shield in and/or on the substrate, (b) irradiating the microelectronic device at a plurality of frequencies to at least partially cure the curable component, and (c) while irradiating the device, at least partially reflecting the radiation directed toward the radiation sensitive component with the shield.

Another aspect of the invention is directed to microelectronic devices. In one embodiment, a microelectronic device includes a substrate, a radiation sensitive component at the substrate, a curable component at the substrate, and a barrier at the substrate. The barrier is configured to at least partially inhibit irradiation of the radiation sensitive component during curing. For example, the barrier may have a thickness selected to at least partially reflect the radiation directed toward the radiation sensitive component and may be of sufficient thickness to reflect the incident radiation.

Specific details of several embodiments of the invention are described below with reference to microelectronic devices including microelectronic dies and interposer substrates, but in other embodiments the microelectronic devices can include other components. For example, the microelectronic devices can include a microfeature workpiece upon which and/or in which micromechanical components, data storage elements, optics, read/write components, or other features are fabricated. Microfeature workpieces can be semiconductor wafers such as silicon or gallium arsenide wafers, glass substrates, insulative substrates, and many other types of materials. Moreover, the microelectronic devices can include a single microelectronic component or an assembly of multiple components. Several details describing well-known structures or processes often associated with fabricating microelectronic dies and microelectronic devices are not set forth in the following description for purposes of brevity and clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 2-8.

Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

Figure 2:
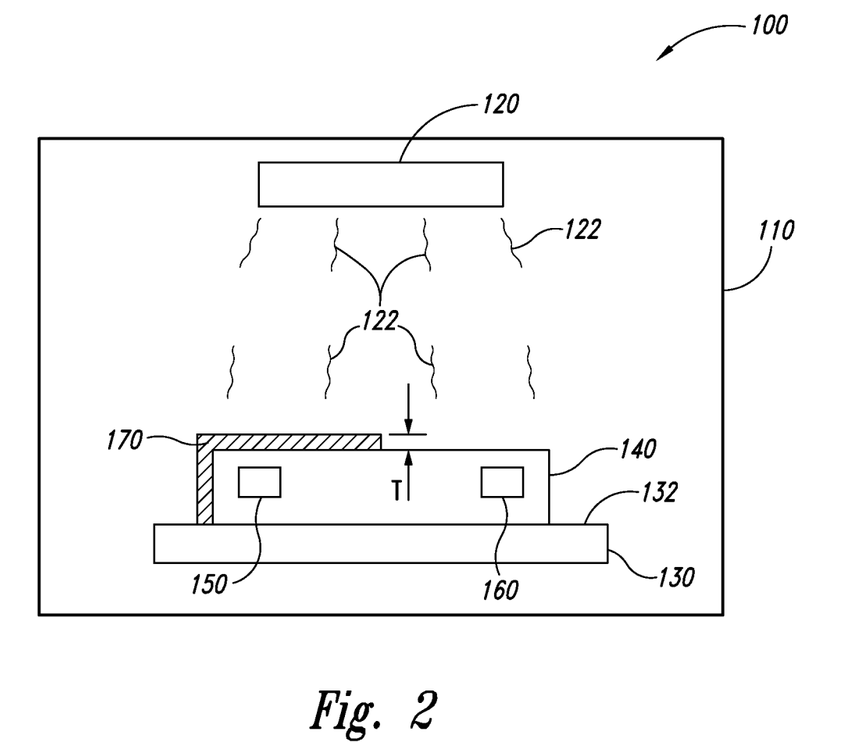
FIG. 2 is a schematic view of a microelectronic device and a system for curing one or more components of the device in accordance with one embodiment of the invention.

B. Embodiments of Microelectronic Devices and Systems for Manufacturing the Devices FIG. 2 is a schematic view of a microelectronic device 140 and a system 100 for curing one or more components of the device 140 in accordance with one embodiment of the invention. The illustrated system 100 includes a radiation chamber 110, a radiation generator 120 for generating electromagnetic radiation in the chamber 110, and a support member 130 for carrying the microelectronic device 140 in the chamber 110. The illustrated radiation generator 120 generates variable-frequency microwave radiation 122 for irradiating the microelectronic device 140 to cure one or more components in the device 140. In several applications, the range of frequencies is between approximately 0.9 GHz and 90 GHz, although in other embodiments the range of frequencies can include frequencies less than 0.9 GHz or more than 90 GHz. In either case, the range of frequencies is selected based on the material(s) to be cured because different materials may have different optimal curing frequencies. By varying the frequency, the radiation generator 120 reduces and/or eliminates (a) arcing between various components of the microelectronic device 140, and (b) excessive heat accumulation at localized portions of the device 140. In additional embodiments, however, the radiation generator 120 may generate microwave radiation at a fixed frequency or other types of electromagnetic radiation at a fixed or variable frequency for curing one or more components of the microelectronic device 140.

The support member 130 is configured to support and position the microelectronic device 140 relative to the radiation generator 120 so that the device 140 is exposed to the microwave radiation 122. The illustrated support member 130 has a surface 132 on which the microelectronic device 140 rests such that the device 140 is exposed within the chamber 110. In other embodiments, the support member 130 may enclose the microelectronic device 140 to inhibit heat from radiating from the edges of the device 140 and maintain a generally uniform temperature throughout the device 140 during curing. As a result of the uniform temperature, the curable components are expected to cure generally uniformly throughout the microelectronic device 140. In either case, the support member 130 can be composed of quartz, alumina, boron nitride, or other suitable materials for carrying the microelectronic device 140 without contaminating the device 140. Suitable support members 130 and systems 100 are manufactured by Lambda Technologies of Morrisville, N.C.

The illustrated microelectronic device 140 includes a radiation sensitive component 150 (shown schematically), a curable component 160 (shown schematically), and a barrier 170 positioned to inhibit irradiation of the radiation sensitive component 150. The radiation sensitive component 150 is a constituent or element of the device 140 that can be damaged or otherwise irreversibly affected by exposure to the microwave radiation 122. The radiation sensitive component 150, for example, can be doped silicon, chalcogenide, polymeric random access memory, or any other component that is irreversibly altered when irradiated with the radiation 122 generated by the radiation generator 120. For example, when a heavily doped structure in a silicon substrate is sufficiently irradiated, the dopant atoms can diffuse throughout the substrate and potentially render the doped structure and other features in the substrate defective. The curable component 160 is a constituent or element of the device 140 that requires exposure to the microwave radiation 122 generated by the radiation generator 120 for curing. The curable component 160 can be an adhesive, an underfill layer, an encapsulant, a stand-off, or any other feature constructed of a material that requires curing by irradiation.

The radiation sensitive component 150 and the curable component 160 can be formed in and/or on the same substrate, or they can be different members of an assembly. Although the illustrated microelectronic device 140 includes a single radiation sensitive component 150 and a single curable component 160, in other embodiments, the microelectronic device 140 may have multiple radiation sensitive components and/or multiple curable components. Moreover, in embodiments in which the radiation generator 120 irradiates the device 140 with electromagnetic radiation outside of the microwave range, the radiation sensitive component 150 is irreversibly affected by the particular frequency of radiation generated by the radiation generator 120 and the curable component 160 is at least partially cured by the particular frequency of radiation.

The barrier 170 is a structure formed in and/or on the microelectronic device 140 to inhibit irradiation of the radiation sensitive component 150 during curing of the curable component 160. As such, the barrier 170 reflects and/or absorbs radiation directed toward the radiation sensitive component 150 to prevent the microwave radiation 122 from damaging or otherwise irreversibly changing the component 150. The barrier 170 can be an external and/or internal structure on the device 140 and be composed of a conductive material that is generally reflective of the microwave radiation 122. For example, suitable barrier materials include silver, copper, gold, other conductive materials. In either case, the barrier 170 has a thickness T selected to reflect sufficient microwave radiation 122 such that the radiation 122 does not render the radiation sensitive component 150 defective. The thickness T is based on the composition of the barrier material. Specifically, barriers composed of highly conductive materials can be thinner than barriers composed of less conductive materials. The barrier 170 can be formed by depositing a layer of material onto the device using plating, electroplating, electroless deposition, chemical vapor deposition, plasma deposition, stenciling, or other suitable processes.

The barrier 170 can be a temporary or permanent structure on the microelectronic device 140. For example, the barrier 170 can be formed on and/or in the microelectronic device 140 before curing the curable component 160 and subsequently removed via etching, sputtering, or other suitable processes after curing the component 160. Alternatively, the barrier 170 may not be removed after curing, but rather can remain on the microelectronic device 140 throughout at least the remainder of the manufacturing process. As described below with reference to FIG. 5, in several embodiments in which the barrier 170 is a permanent structure on the microelectronic device 140, the barrier 170 can also be a ground plane, or a plurality of electrical traces, or the barrier 170 may perform another function in the device 140 in addition to reflecting the microwave radiation 122.

One feature of the microelectronic device 140 illustrated in FIG. 2 is that the device 140 includes a barrier 170 for inhibiting irradiation of the radiation sensitive component 150. An advantage of this feature is that the curable component 160 can be irradiated with variable-frequency microwave radiation to at least partially cure the component 160 without exposing the radiation sensitive component 150 to particular frequencies of microwave radiation that irreversibly alter the component 150. Although the curable component 160 could be irradiated at a fixed microwave frequency that may not damage the radiation sensitive component 150, variable-frequency microwave radiation is preferable because it reduces and/or eliminates (a) the build-up of a charge differential between different components in a microelectronic device, and (b) excess heat accumulation at localized portions of the device.

C. Additional Embodiments of Microelectronic Devices

Figure 3:
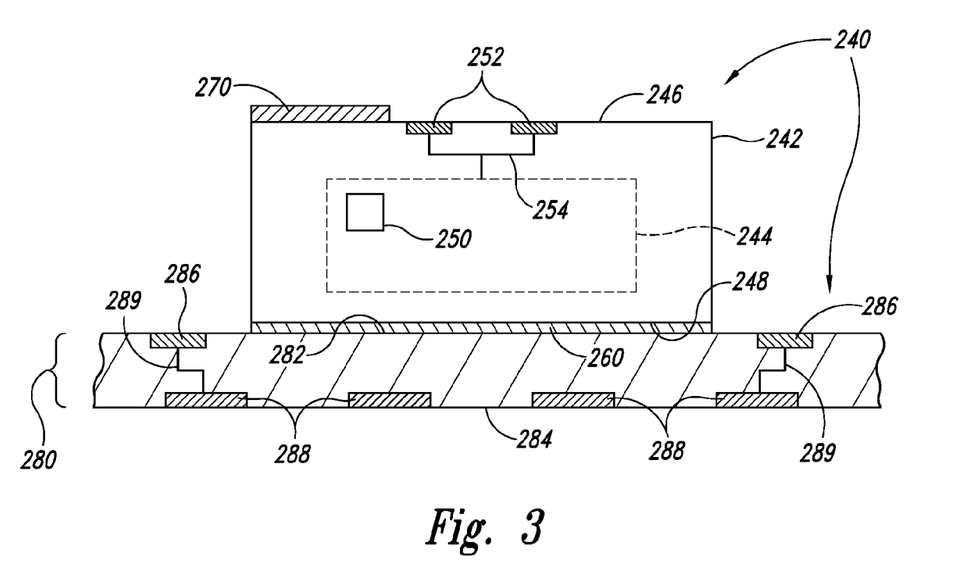
FIG. 3 is a schematic side cross-sectional view of a microelectronic device in accordance with another embodiment of the invention.

FIG. 3 is a schematic side cross-sectional view of a microelectronic device 240 in accordance with another embodiment of the invention. The illustrated microelectronic device 240 includes a microelectronic die 242 and an interposer substrate 280 carrying the die 242. The microelectronic die 242 includes an integrated circuit 244 (shown schematically in broken lines), a doped region 250 within the integrated circuit 244, an active side 246, a backside 248 opposite the active side 246, a plurality of terminals 252 (e.g., bond-pads) arranged in an array on the active side 246, and a plurality of traces 254 electrically coupling the terminals 252 to the integrated circuit 244. The doped region 250 of the integrated circuit 244 is a radiation sensitive component in the illustrated die 242. As such, if the doped region 250 were exposed to the microwave radiation 122 (FIG. 2), the doped region 250 could be irreversibly altered. For example, the microwave radiation 122 may heat the doped region 250 such that the dopant atoms diffuse throughout the integrated circuit 244 and render the die 242 and the integrated circuit 244 defective. In other embodiments, the die 242 can include other radiation sensitive components in lieu of or in addition to the doped region 250.

The interposer substrate 280 can be a printed circuit board or other support member for carrying the die 242. In the illustrated embodiment, the interposer substrate 280 includes a first side 282 with a plurality of first contacts 286 and a second side 284 with a plurality of pads 288. The first contacts 286 can be arranged in an array for electrical connection to corresponding terminals 252 on the die 242. The pads 288 can be arranged in arrays to receive a plurality of electrical couplers (e.g., solder balls) to connect the interposer substrate 280 to an external device. The interposer substrate 280 further includes a plurality of conductive traces 289 electrically coupling the contacts 286 to corresponding pads 288.

The illustrated microelectronic device 240 further includes (a) an adhesive 260 coupling the backside 248 of the die 242 to the first side 282 of the interposer substrate 280, and (b) a barrier 270 disposed on the active side 246 of the die 242. The adhesive 260 can be an adhesive film, epoxy, tape, paste, or other suitable material for bonding the die 242 to the interposer substrate 280. In the illustrated embodiment, the adhesive 260 is a curable component that is cured via exposure to the microwave radiation 122 (FIG. 2) generated by the radiation generator 120 (FIG. 2). The barrier 270 is configured to shield the doped region 250 from irradiation during the curing process. Specifically, the barrier 270 is sized and positioned to reflect the microwave radiation 122 directed toward the doped region 250 and inhibit the radiation 122 from impinging upon the doped region 250. The barrier 270 is also configured to minimize the reflection of microwave radiation directed toward the adhesive 260 so that the radiation generator 120 can irradiate and cure the adhesive 260. For example, in the illustrated embodiment, the microwave radiation 122 can diffract around the barrier 270 such that the radiation 122 irradiates the section of the adhesive 260 below the doped region 250 but does not irradiate the doped region 250. In other similar embodiments, the entire strip of adhesive 260 may not be irradiated depending on the thickness of the die 242, the size and position of the barrier 270, the position of the radiation generator 120, and other factors.

D. Additional Embodiments of Barriers for Microelectronic Devices

Figure 4:
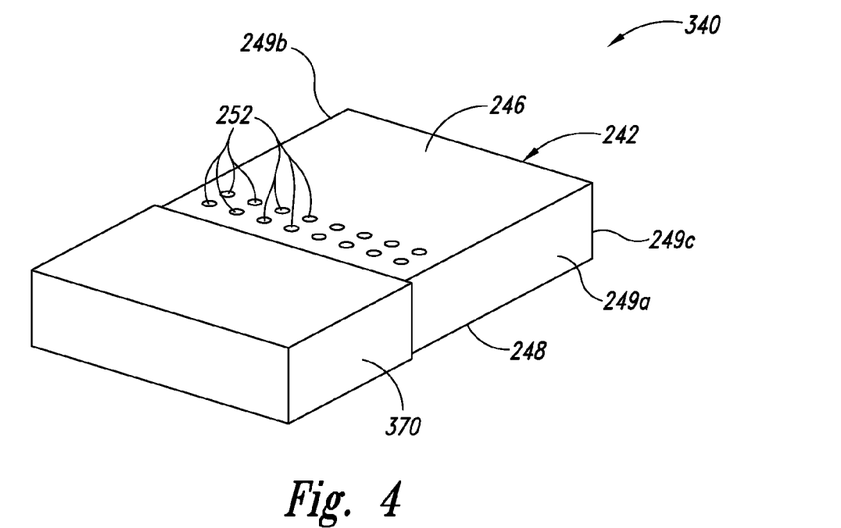
FIGS. 4-6 illustrate different configurations of barriers for use with microelectronic devices in accordance with several embodiments of the invention.
Figure 5:
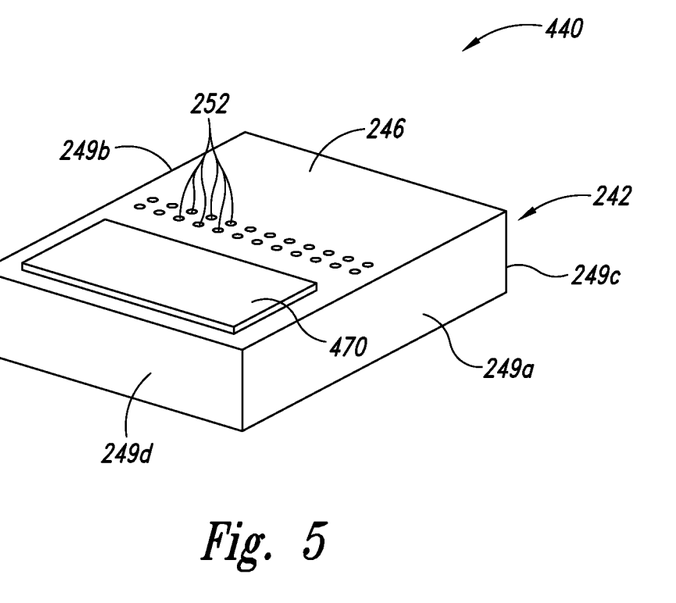
Figure 6:
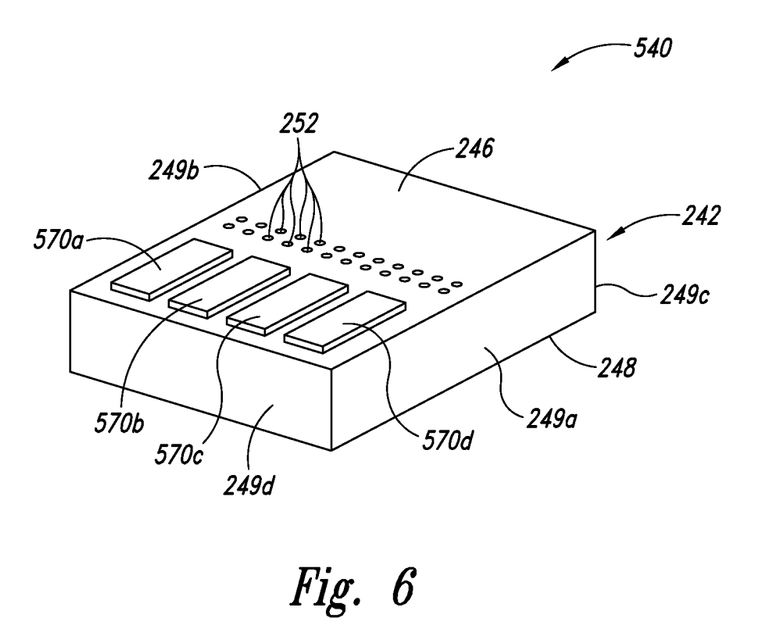

FIGS. 4-6 illustrate different configurations of barriers for use with microelectronic devices in accordance with several embodiments of the invention. For example, FIG. 4 is a schematic isometric view of a microelectronic device 340 including a microelectronic die 242 and a barrier 370 encasing a portion of the die 242. The illustrated die 242 is generally similar to the die 242 described above with reference to FIG. 3. For example, the die 242 includes an active side 246, a backside 248 opposite the active side 246, and a plurality of ends 249 (illustrated individually as 249a-c) extending between the active side 246 and backside 248. The illustrated barrier 370 covers a portion of the active side 246, a portion of a first end 249a, a portion of a second end 249b, and a fourth end (not shown) of the die 242.

FIG. 5 is a schematic isometric view of a microelectronic device 440 including a barrier 470 covering only a portion of the active side 246 of the die 242. The size and position of the barrier 470 are selected to inhibit irradiation of a radiation sensitive component(s) in the die 242 without unnecessarily reflecting radiation directed toward a curable component(s) in or proximate to the die 242.

FIG. 6 is a schematic isometric view of a microelectronic device 540 including a plurality of barrier members 570 (identified individually as 570a-d) on the die 242. The individual barrier members 570 are sized and configured to inhibit irradiation of the radiation sensitive component(s) within the die 242. The illustrated barrier members 570 are spaced apart to minimize the reflection of radiation directed toward the curable component(s). Although the illustrated embodiment includes four barrier members 570, in other embodiments, a different number of barrier members can be formed on the die 242.

E. Additional Embodiments of Microelectronic Devices

Figure 7:
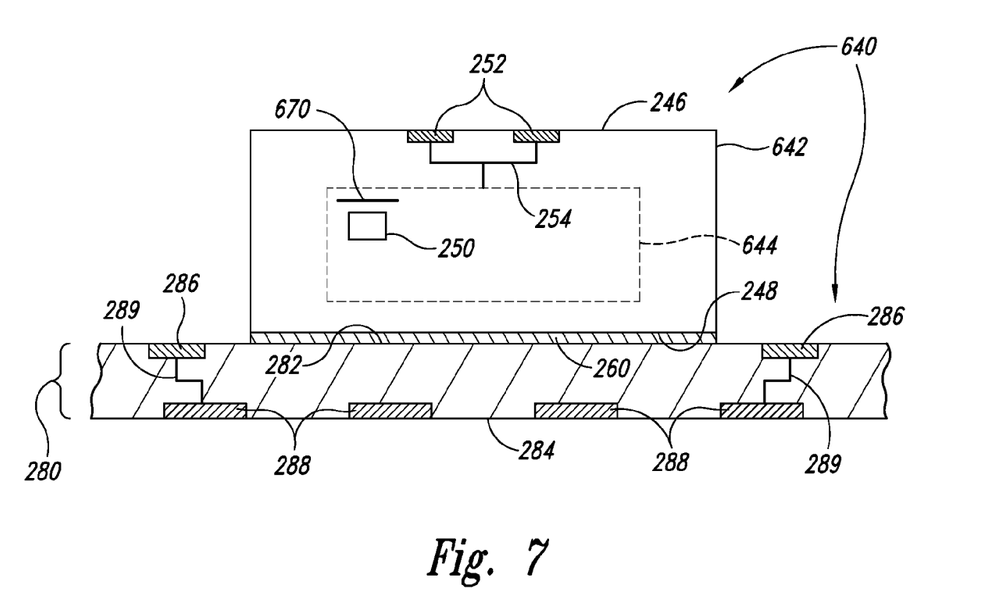
FIG. 7 is a schematic side cross-sectional view of a microelectronic device in accordance with another embodiment of the invention.

FIG. 7 is a schematic side cross-sectional view of a microelectronic device 640 in accordance with another embodiment of the invention. The microelectronic device 640 is generally similar to the microelectronic device 240 described above with reference to FIG. 3. For example, the microelectronic device 640 includes a microelectronic die 642 attached to an interposer substrate 280. The illustrated microelectronic die 642, however, includes an integrated circuit 644 (shown schematically in broken lines), a doped region 250 (shown schematically) in the integrated circuit 644, and a barrier 670 in the integrated circuit 644. In the illustrated embodiment, the barrier 670 performs several functions. For example, the barrier 670 can be a ground plane, one or more traces, or another conductive structure in the integrated circuit 644 such that the barrier 670 both (a) reflects radiation directed toward the doped region 250, and (b) carries signals or provides a ground line within the integrated circuit 644. As a result, the thickness of the barrier 670 must be sufficient to perform both requirements. In other embodiments, the barrier 670 may be positioned in the integrated circuit 644 but serve no purpose other than shielding the doped region 250 from radiation. In additional embodiments, the barrier 670 may be formed in the die 642 but not be part of the integrated circuit 644.

Figure 8:
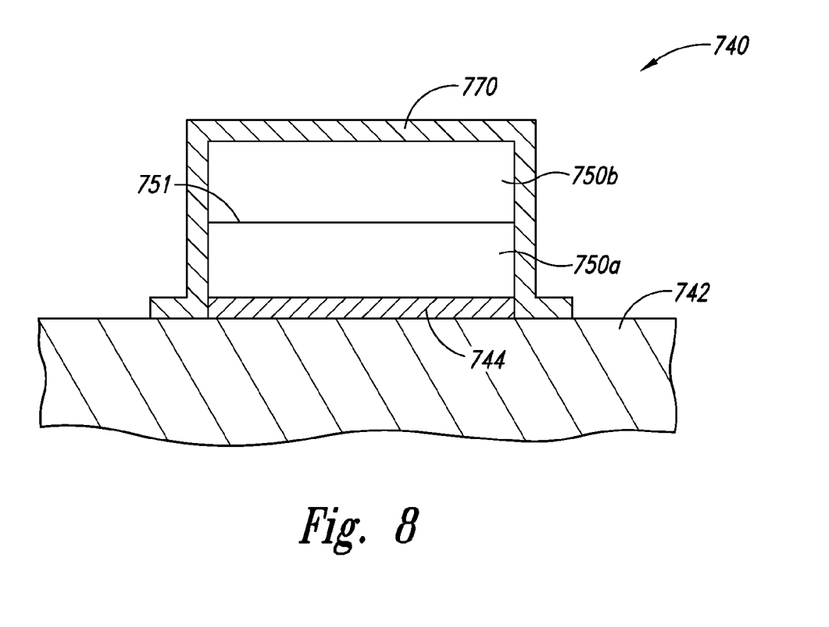
FIG. 8 is a schematic side cross-sectional view of a microelectronic device in accordance with another embodiment of the invention.

FIG. 8 is a schematic side cross-sectional view of a microelectronic device 740 in accordance with another embodiment of the invention. The microelectronic device 740 includes a substrate 742, a contact pad 744 on the substrate 742, a doped region 750 (identified as 750a-b) over the contact pad 744, and a barrier 770 shielding the doped region 750. The illustrated doped region 750 includes a first doped material 750a on the contact pad 744 and a second doped material 750b stacked on the first doped material 750a. The first and second doped materials 750a-b are different materials separated by a diffusion zone 751. The barrier 770 is positioned over the first and second doped materials 750a-b to reflect and/or block radiation directed toward the doped materials 750a-b. Accordingly, the barrier 770 inhibits radiation from irreversibly altering the doped region 750, such as causing the dopant atoms in the first doped material 750a to diffuse across the diffusion zone 751 and into the second doped material 750b. In other embodiments, additional layers of doped material may be included in the doped region 750.

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. A microelectronic device, comprising:
    a semiconductor substrate;
    a radiation sensitive component disposed in and/or on the semiconductor substrate, wherein the radiation sensitive component is irreversibly affected by an exposure to radiation in a selected range of frequencies;
    a radiation curable component disposed in and/or on the semiconductor substrate and aligned with the radiation sensitive component, wherein the radiation curable component comprises a material at least partially curable by an exposure to radiation in the selected range of frequencies; and
    a barrier positioned at least proximate the semiconductor substrate, wherein the barrier is configured to at least partially inhibit irradiation of the radiation sensitive component and to at least partially expose the radiation curable material to radiation in the selected range of frequencies during curing.

2. The microelectronic device of claim 1 wherein the barrier comprises a conductive structure in and/or on the substrate.

3. The microelectronic device of claim 1 wherein the barrier comprises a conductive structure positioned to at least partially reflect radiation directed toward the radiation sensitive component.

4. The microelectronic device of claim 1 wherein the selected range of frequencies comprises microwave radiation between approximately 0.9 GHz and 90 GHz.

5. The microelectronic device of claim 1 wherein the barrier comprises a conductive coating on a section of the substrate.

6. The microelectronic device of claim 1 wherein the barrier comprises a layer formed on an exterior surface of the substrate.

7. The microelectronic device of claim 1 wherein the barrier comprises a ground plane in the substrate.

8. The microelectronic device of claim 1 wherein the barrier comprises a plurality of traces in the substrate.

9. The microelectronic device of claim 1 wherein the barrier comprises at least one of copper, gold, or silver.

10. A microelectronic device, comprising:
    a substrate;
    a radiation curable material positioned in and/or on the substrate, wherein the radiation curable material is at least partially curable by an exposure to radiation in a selected range of frequencies;
    a radiation sensitive component formed in and/or on the substrate and aligned with the radiation curable material, wherein the radiation sensitive component is irreversibly altered by an exposure to radiation in the selected range of frequencies; and
    means for at least partially reflecting radiation directed toward the radiation sensitive component, the means for at least partially reflecting radiation being positioned at least proximate the substrate and being configured to at least partially expose the radiation curable material to radiation in the selected range of frequencies.

11. The microelectronic device of claim 10 wherein the means for at least partially reflecting radiation comprise a barrier configured to at least partially inhibit irradiation of the radiation sensitive component during curing.

12. The microelectronic device of claim 10 wherein the means for at least partially reflecting radiation comprise a conductive structure in and/or on the substrate.

13. The microelectronic device of claim 10, further comprising a curable component in and/or on the substrate, wherein the means for at least partially reflecting radiation comprise a conductive barrier positioned to allow irradiation of at least part of the curable component during curing.

14. A microelectronic device, comprising:
    a semiconductor substrate;
    a structure disposed at least proximate the semiconductor substrate, wherein the structure is generally reflective of microwave radiation;
    a radiation sensitive component disposed between the semiconductor substrate and the structure, wherein the radiation sensitive component is rendered defective by an exposure to radiation in a predetermined bandwidth; and
    an adhesive disposed in and/or on the semiconductor substrate and aligned with the radiation sensitive component, wherein the adhesive comprises a material that is at least partially curable by an exposure to radiation in the predetermined bandwidth.

15. The microelectronic device of claim 14 wherein the structure is permanently coupled to the semiconductor substrate.

16. The microelectronic device of claim 14 wherein the structure is removably attached to the semiconductor substrate.

17. The microelectronic device of claim 14 wherein the structure is configured to:
    at least partially block incident radiation in the predetermined bandwidth directed toward the radiation sensitive component; and
    at least partially expose the adhesive to incident radiation in the predetermined bandwidth.

18. The microelectronic device of claim 14 wherein the radiation sensitive component comprises doped silicon.

19. The microelectronic device of claim 14 wherein the adhesive has been cured by variable frequency microwave radiation in the predetermined bandwidth.

* * * * *